(12) United States Patent
Hsu

(10) Patent No.: US 7,579,918 B2
(45) Date of Patent: Aug. 25, 2009

(54) CLOCK GENERATOR WITH REDUCED ELECTROMAGNETIC INTERFERENCE FOR DC-DC CONVERTERS

(75) Inventor: Kuo-Chun Hsu, Miaoli (TW)

(73) Assignees: Taiwan Semiconductor Manufacturing Co., Ltd., Hsin-Chu (TW); Global Unichip Corp., Hsin-Chu (TW)

( * ) Notice: Subject to any disclaimer, the term of this patent is extended or adjusted under 35 U.S.C. 154(b) by 159 days.

(21) Appl. No.: 11/647,626

(22) Filed: Dec. 28, 2006

(65) Prior Publication Data

US 2008/0157831 A1  Jul. 3, 2008

(51) Int. Cl.
*H03K 3/02* (2006.01)

(52) U.S. Cl. .................. 331/143; 331/111; 331/177 R; 327/132; 323/282

(58) Field of Classification Search .......... 331/111, 331/143, 177 R, 34; 327/101, 131, 132, 327/164; 323/282, 283, 284, 288
See application file for complete search history.

(56) References Cited

U.S. PATENT DOCUMENTS

| | | | |
|---|---|---|---|
| 6,356,161 B1 * | 3/2002 | Nolan et al. ............... | 331/176 |
| 6,680,656 B2 | 1/2004 | Chen ......................... | 331/143 |
| 6,969,978 B2 | 11/2005 | Dening ...................... | 323/282 |
| 6,980,039 B1 | 12/2005 | Dening et al. .............. | 327/164 |
| 2002/0050868 A1 * | 5/2002 | Chen ......................... | 331/143 |

FOREIGN PATENT DOCUMENTS

JP        08154040 A  *   6/1996

OTHER PUBLICATIONS

CN PTO Office Action.

* cited by examiner

*Primary Examiner*—Robert Pascal
*Assistant Examiner*—Ryan J. Johnson
(74) *Attorney, Agent, or Firm*—K & L Gates LLP

(57) ABSTRACT

A clock generator includes a current source for generating a constant current; a current mirror coupled between a supply voltage and the current source for generating a mirror current equal to the constant current multiplied by a predetermined value; and a charge control module coupled with the current source and the current mirror for charging a capacitor when a voltage thereof is lower than a predetermined threshold voltage and for discharging the capacitor when the voltage thereof is higher than the predetermined threshold voltage, thereby generating a clock signal at a predetermined frequency, wherein the charge control module adjusts the predetermined frequency by changing the predetermined threshold voltage.

19 Claims, 3 Drawing Sheets

US 7,579,918 B2

CLOCK GENERATOR WITH REDUCED ELECTROMAGNETIC INTERFERENCE FOR DC-DC CONVERTERS

BACKGROUND

The present invention relates generally to integrated circuit designs, and more particularly to a clock generator with reduced electromagnetic interference (EMI).

A DC-to-DC converter is one of the important circuit modules typically embedded in portable electronic devices, such as cellular phones, personal digital assistants, and laptop computers. These portable devices are powered by batteries, which often supply power at a voltage level that cannot be readily used by internal circuit modules of the devices. In addition, the voltage level of the power supplied by the battery declines as its stored power is drained over time. The DC-to-DC converter functions to shift the voltage level of the power supplied by the battery to a level that can be used by the internal circuit modules of the portable devices, even when the supplied power declines.

The DC-to-DC converter is typically implemented with a clock generator that controls the power output of the battery in order to achieve power efficiency. The clock generator outputs a clock signal to switch on and off a DC voltage supplied to the DC-to-DC converter at a predetermined frequency in order to control the timing of converting the power stored in the battery. This conversion scheme is more efficient than a linear conversion scheme, in which the unwanted power has to be dissipated as waste.

One drawback of the conventional clock generator is that it is particularly prone to generate EMI, a phenomenon where unwanted signals among electronic components of a circuit are induced by other circuits carrying rapidly changing signals. This interrupts, obstructs and degrades the performance of the circuits affected by the EMI. As such, it is desired to design a clock generator that causes less EMI than the conventional design for the DC-to-DC converter.

SUMMARY

The present invention discloses a clock generator. In one embodiment of the present invention, the clock generator includes a current source for generating a constant current; a current mirror coupled between a supply voltage and the current source for generating a mirror current equal to the constant current multiplied by a predetermined value; and a charge control module coupled with the current source and the current mirror for charging a capacitor when a voltage thereof is lower than a predetermined threshold voltage and for discharging the capacitor when the voltage thereof is higher than the predetermined threshold voltage, thereby generating a clock signal at a predetermined frequency, wherein the charge control module adjusts the predetermined frequency by changing the predetermined threshold voltage.

The construction and method of operation of the invention, however, together with additional objectives and advantages thereof will be best understood from the following description of specific embodiments when read in connection with the accompanying drawings.

DESCRIPTION

Figure 1:
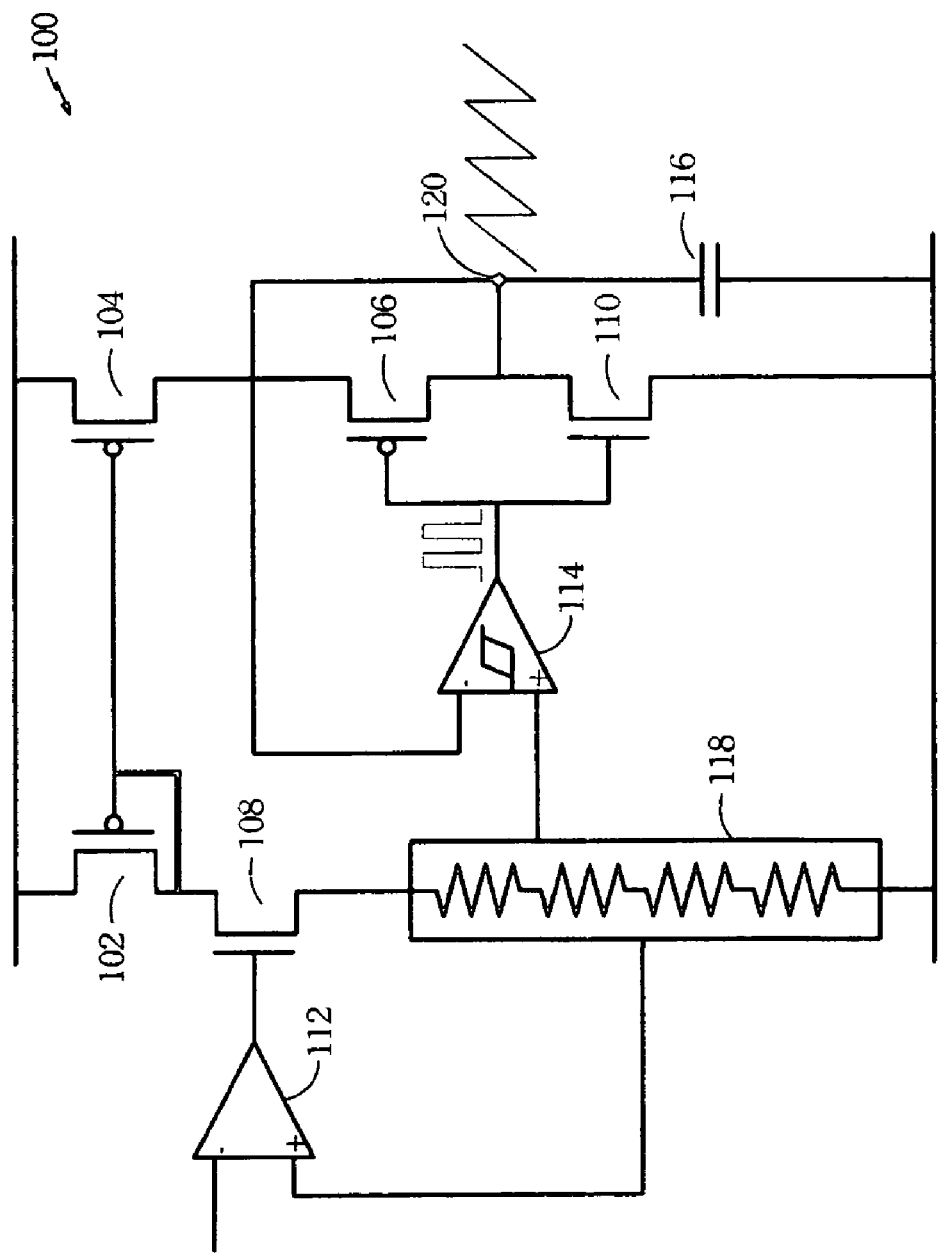
FIG. 1 schematically illustrates a conventional clock generator.

Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a conventional clock generator 100 that can be used for a DC-to-DC converter. The clock generator 100 includes PMOS transistors 102, 104 and 106, NMOS transistors 108 and 110, a comparator 114, an amplifier 112, a capacitor 116, and a resistor module 118, which is comprised of a number of serially connected resistors. The NMOS transistor 108, the resistor module 118 and the amplifier 112 together form a current source that provides a constant current (I). The PMOS transistors 102 and 104 form a current mirror that reflects the current flowing across the PMOS transistor 102 to generate a mirror current flowing across the PMOS transistor 104. The comparator 114 has a first input terminal coupled to the capacitor 116 through a node 120 and a second input terminal receiving a voltage signal from the resistor module 118. At an initial state, the voltage at the node 120 is lower than the voltage of the output signal generated by the resistor module 118, and the comparator 114 generates a low output signal to turn on the PMOS transistor 106. This allows the mirror current to pass through the PMOS transistor 106 to charge the capacitor 116. As the capacitor is being charged, the voltage at the node 120 increases until it exceeds the threshold voltage generated by the resistor module 118. When this happens, the comparator 114 generates a high output signal, which turns off the PMOS transistor 106 and turns on the NMOS transistor to discharge the capacitor 120. Once the voltage at the node 120 falls below the threshold voltage generated by the resistor module 118, the comparator 114 will turn off the NMOS transistor 110, turn-on the PMOS transistor, and start charging the capacitor 116 again. It is noted that the discharging process occurs more rapidly than the charging process. Thus, the clock signal at the node 120 will have a saw-teeth-like waveform.

The frequency of the saw-teeth-like waveform of the clock signal at the node 120 is determined by the following equation:

$$f = I/(C*V)$$

where f denotes frequency, I denotes the current generated by the current source, C denotes the capacitance of the capacitor 116, and V denotes the threshold voltage, above which the capacitor 116 is discharged. It is understood by those skilled in the art of integrated circuit design that the EMI caused by the clock generator 100 depends on the frequency of the clock signal it generates. In order to control the EMI, it is desired for the integrated circuit designers to modulate the frequency of the clock signal. Conventionally, the frequency is modulated by changing either the current (I) or the capacitance (C). However, both ways require a redesign of the semiconductor structure by which the clock generator 100 is implemented. This redesign process can incur significant costs in terms of revising the circuit layouts in order to implement the modified clock generator on semiconductor materials.

Figure 2:
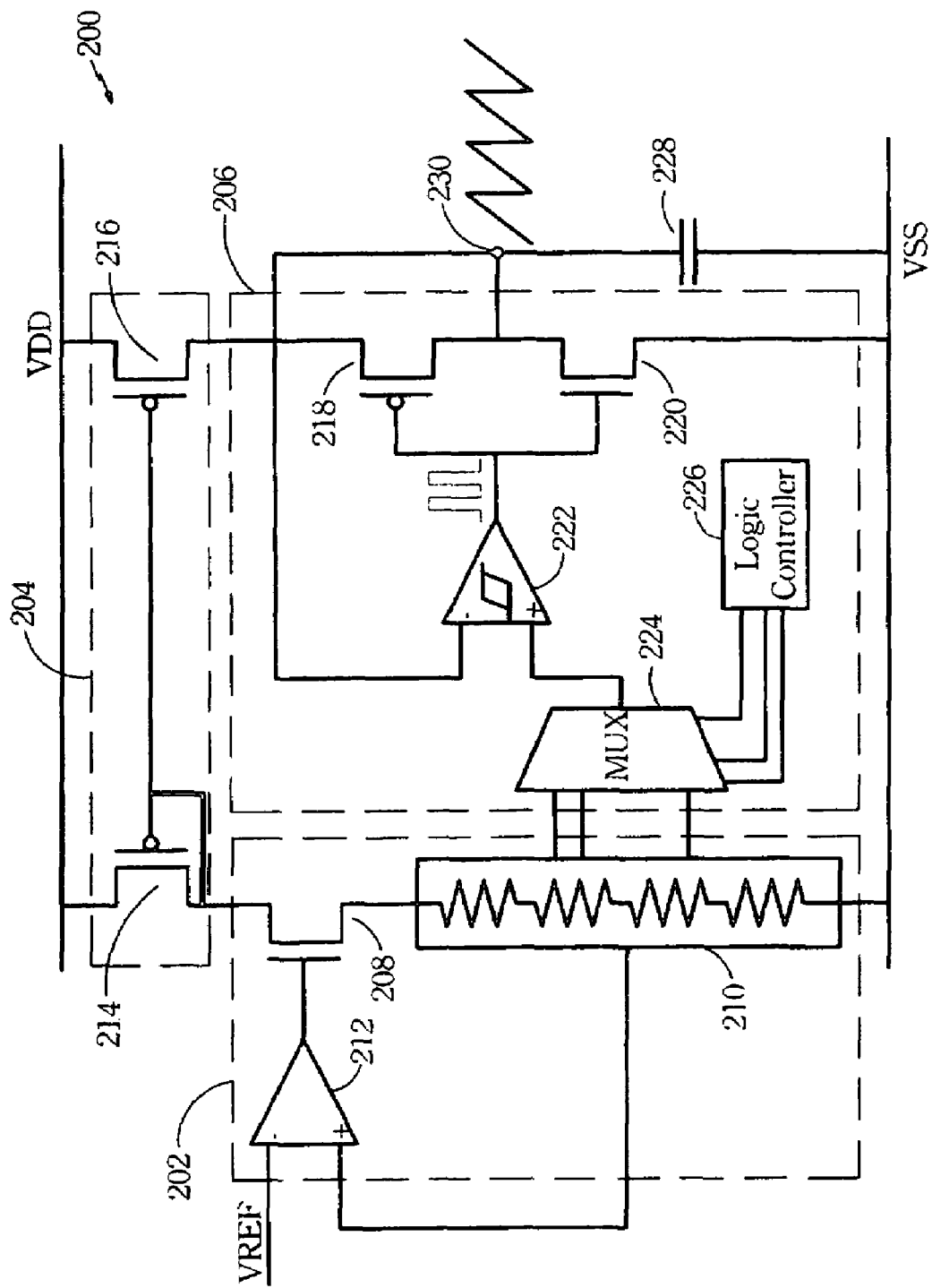
FIG. 2 schematically illustrates a clock generator in accordance with one embodiment of the present invention.

FIG. 2 illustrates a clock generator 200 in accordance with one embodiment of the present invention. The clock generator 200 includes a current source 202, a current mirror 204 coupled between a supply voltage VDD and the current source 202, and a charge control module 206 coupled among the current source 202, the current mirror 204, and an electrical ground VSS.

The current source 202 includes an NMOS transistor 208 having a drain coupled to the supply voltage VDD through the current mirror 204, and a source coupled to the electrical ground VSS through the resistor module 210, which is comprised of a plurality of serially connected resistors. The gate of the NMOS transistor 208 is controlled by an output of an amplifier 212, which has a first input terminal receiving a reference voltage and a second input terminal coupled to the resistor module 210. The current source 202 provides a constant current when the reference voltage received at one input terminal of the amplifier 212 is equal to the voltage received at its other input terminal coupled to the resistor module 210.

The current mirror 204 includes two PMOS transistors 214 and 216. The PMOS transistor 214 has a source coupled to the supply voltage VDD and a drain coupled to the drain of the NMOS transistor 208. The PMOS transistor 216 has a source coupled to the supply voltage VDD, a drain coupled to the charge control module 206, and a gate tied to the gate of the PMOS transistor 214, which is further connected to the drain thereof. The current mirror 204 generates a mirror current equal to the constant current generated by the current source 202 multiplied by a predetermined value.

The charge control module 206 includes a PMOS transistor 218, an NMOS transistor 220, a comparator 222, a multiplexer 224, and a logic controller 226. The multiplexer 224 has a plurality of input terminals coupled to the resistor module 210 for receiving output signals at various voltage levels. The logic controller 226 is coupled to the multiplexer 224 to select the voltage level from the output signals received from the resistor module 210 as its output. The comparator 222 has a first input terminal coupled to the output of the multiplexer 224, and a second input terminal coupled to a capacitor 228 via a node 230. The comparator 222 has an output terminal coupled to the gates of the PMOS transistor 218 and the NMOS transistor 220, in which the PMOS transistor 218 has a source coupled to the drain of the PMOS transistor 216 and the NMOS transistor has a source coupled to the electrical ground VSS. The drains of the PMOS transistor 218 and the NMOS transistor 220 are tied together at the node 230.

At an initial state of operation, the voltage at the node 230 is lower than the voltage of the output generated by the multiplexer 224, and the comparator 222 generates a low output signal to turn on the PMOS transistor 218. This allows the mirror current to pass through the PMOS transistor 218 to charge the capacitor 228. As the capacitor is being charged, the voltage at the node 230 increases until it exceeds the voltage of the output generated by the multiplexer 224. When this happens, the comparator 222 generates a high output signal, which turns off the PMOS transistor 218 and turns on the NMOS transistor 220 to discharge the capacitor 228. Once the voltage at the node 230 falls below the voltage of the output generated by the multiplexer 224, the comparator 222 will turn off the NMOS transistor 220, turn on the PMOS transistor 218, and start charging the capacitor again. Thus, the node 230 will generate a saw-teeth-like clock signal.

The charge control module 206 is able to adjust the threshold voltage at which the capacitor 228 is switching from a charging mode to a discharging mode. As mentioned above, the frequency of the clock signal is determined by the equation $f=I/(C*V)$, the smaller the threshold voltage V, the greater the frequency of the clock signal. In this embodiment, the threshold voltage is adjusted by changing the voltage level of the output signal selected to pass from the resistor module 210 to the comparator 222. The higher the voltage level generated by the multiplexer 224, the higher the threshold voltage at which the PMOS transistor 218 and the NMOS transistor 220 will be switched on and off, and therefore the lower the frequency of the clock signal generated at the node 230. Since the EMI caused by the clock generator 200 depends on the frequency of the clock signal it generates, by controlling the frequency of the clock signal, the clock generator 200 is able to control the EMI it may cause.

Figure 3:
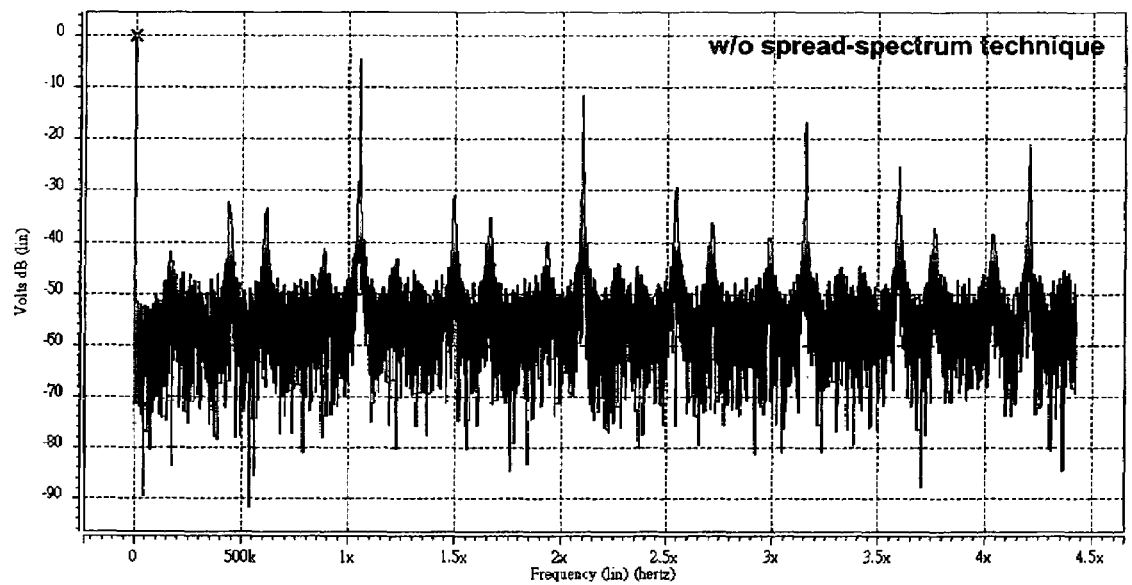
FIG. 3 illustrates a graph showing a frequency spectrum of a conventional clock generator.
Figure 4:
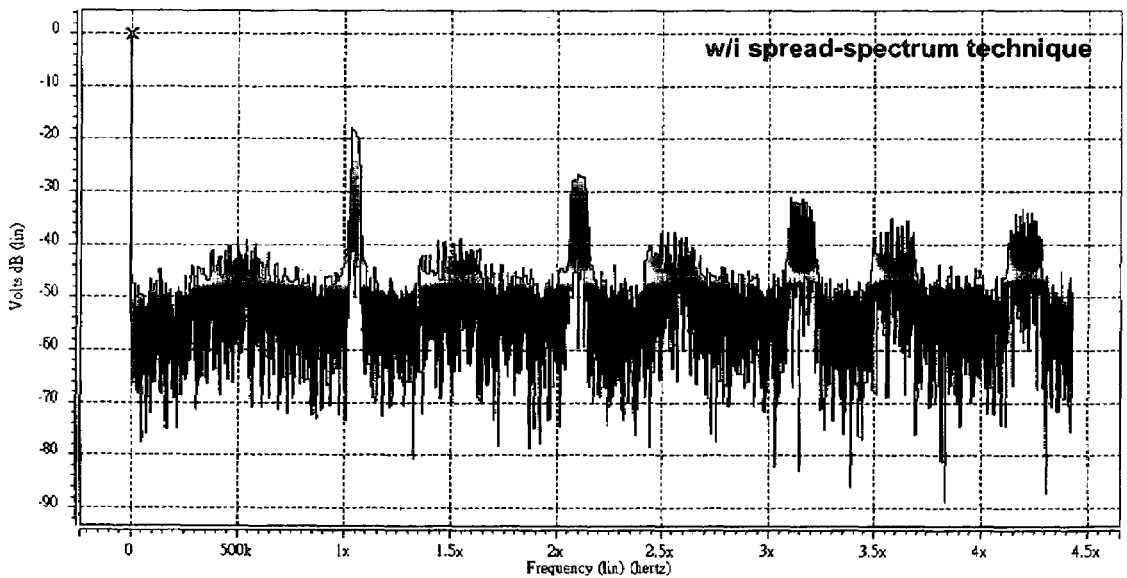
FIG. 4 illustrates a graph showing a frequency spectrum of the proposed clock generator in accordance with one embodiment of the present invention.

FIGS. 3 and 4 illustrates graphs showing frequency spectrums of the conventional and proposed clock generators, respectively, simulated by a Simulation Program with Integrated Circuit Emphasis (SPICE) simulator, a tool that is used to simulate and analyze electrode systems. The x-axis represents frequency, and the y-axis represents power. The overall power of the frequency spectrum of the conventional clock showed in FIG. 3 is greater than that of the proposed clock generator showed in FIG. 4 at their peak frequencies. Thus, the proposed clock generator can significantly reduce the power of the main tone and harmonic tone of its frequency spectrum. With reduced output noise power, the EMI caused by the proposed clock generator can therefore be greatly reduced.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A clock generator comprising:
   a current source for generating a constant current;
   a current mirror coupled between a supply voltage and the current source for generating a mirror current equal to the constant current multiplied by a predetermined value; and
   a charge control module coupled with the current source and the current mirror for charging a capacitor when a voltage thereof is lower than a predetermined threshold voltage and for discharging the capacitor when the voltage thereof is higher than the predetermined threshold voltage, thereby generating a clock signal at a predetermined frequency, wherein the charge control module includes a multiplexer coupled to the current source for receiving input signals having various voltage levels from the current source,
   wherein the charge control module adjusts the predetermined frequency by selecting the voltage level of the input signals received from the current source to change the predetermined threshold voltage.

2. The clock generator of claim 1, wherein the current mirror comprises:

a first PMOS transistor having a source coupled to the supply voltage, a drain coupled to the current source, and a gate; and a second PMOS transistor having a source coupled to the supply voltage, a drain coupled to the charge control module, and a gate coupled to the gate of the first PMOS transistor.

3. The clock generator of claim 2, wherein the current source comprises:

a first NMOS transistor having a drain coupled to the drain of the first PMOS transistor;

a resistor module coupled between a source of the first NMOS transistor and an electrical ground; and an amplifier having a first input terminal coupled to a reference voltage, a second input terminal coupled to the resistor module, and an output terminal coupled to a gate of the first NMOS transistor.

4. The clock generator of claim 3, wherein the resistor module comprises a number of serially coupled resistors for providing the various voltage levels when the constant current flows there through.

5. The clock generator of claim 1, wherein the charge control module comprises a logic controller coupled to the multiplexer for controlling the same to generate an output signal selected from the various voltage levels provided by the current source.

6. The clock generator of claim 5, wherein the charge control module comprises a third PMOS transistor having a source coupled to the drain of the second PMOS transistor, and a drain coupled to the capacitor.

7. The clock generator of claim 6, wherein the charge control module comprises a second NMOS transistor having a drain coupled to the drain of the third PMOS transistor and the capacitor, a source coupled to the electrical ground, and a gate coupled to a gate of the third PMOS transistor.

8. The clock generator of claim 7, wherein the charge control module comprises a comparator having:

an output terminal coupled to the gates of the third PMOS transistor and the second NMOS transistor;

a first input terminal coupled to the drain of the third PMOS transistor, the drain of the second NMOS transistor, and the capacitor; and second input terminal coupled to the multiplexer for receiving the output signal thereof.

9. The clock generator of claim 8, wherein the predetermined threshold voltage is controlled by selecting the voltage level of the output signal of the multiplexer with the logic controller.

10. A clock generator for a DC-to-DC converter, comprising:

a current source for generating a constant current;

a current mirror coupled between a supply voltage and the current source for generating a mirror current equal to the constant current multiplied by a predetermined value; and a charge control module having a first set of input terminals coupled with the current source for receiving input signals at more than one voltage levels from the current source, and at least one second input terminal coupled with the current mirror for passing the mirror current to charge a capacitor when a voltage thereof is lower than a predetermined threshold voltage and to discharge the capacitor when the voltage thereof is higher than the predetermined threshold voltage, thereby generating a clock signal at a predetermined frequency, wherein the charge control module adjusts the predetermined frequency by selecting the voltage level of the input signals received from the current source to change the predetermined threshold voltage.

11. The clock generator of claim 10, wherein the current mirror comprises:

a first PMOS transistor having a source coupled to the supply voltage, a drain coupled to the current source, and a gate; and a second PMOS transistor having a source coupled to the supply voltage, a drain coupled to the charge control module, and a gate coupled to the gate of the first PMOS transistor.

12. The clock generator of claim 11, wherein the current source comprises:

a first NMOS transistor having a drain coupled to the drain of the first PMOS transistor;

a resistor module coupled between a source of the NMOS transistor and an electrical ground; and an amplifier having a first input terminal coupled to a reference voltage, a second input terminal coupled to the resistor module, and an output terminal coupled to a gate of the first NMOS transistor.

13. The clock generator of claim 12, wherein the resistor module comprises a number of serially coupled resistors for providing the voltage levels of the input signals received by the charge control module.

14. The clock generator of claim 13, wherein the charge control module comprises a multiplexer coupled to the resistor module for selecting the voltage level of the input signals.

15. The clock generator of claim 14, wherein the charge control module comprises a logic controller coupled to the multiplexer for controlling the same to select the voltage level for adjusting the predetermined threshold voltage.

16. The clock generator of claim 15, wherein the charge control module comprises a third PMOS transistor having a source coupled to the drain of the second PMOS transistor, and a drain coupled to the capacitor.

17. The clock generator of claim 16, wherein the charge control module comprises a second NMOS transistor having a drain coupled to the drain of the third PMOS transistor and the capacitor, a source coupled to the electrical ground, and a gate coupled to a gate of the third PMOS transistor.

18. The clock generator of claim 17, wherein the charge control module comprises a comparator having:

an output terminal coupled to the gates of the third PMOS transistor and the second NMOS transistor;

a first input terminal coupled to the drain of the third PMOS transistor, the drain of the second NMOS transistor, and the capacitor; and a second input terminal coupled to the multiplexer.

19. The clock generator of claim 18, wherein the predetermined threshold voltage is controlled by selecting the voltage level of the input signal of the current source with the multiplexer.

* * * * *